United States Patent
Iyengar et al.

(10) Patent No.: US 9,874,413 B2
(45) Date of Patent: *Jan. 23, 2018

(54) DATA CENTER WITH DUAL RADIATOR CABINETS FOR REDUNDANT OPERATION

(75) Inventors: Madhusudan K. Iyengar, Woodstock, NY (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1542 days.

This patent is subject to a terminal disclaimer.

(21) Appl. No.: 13/115,590

(22) Filed: May 25, 2011

(65) Prior Publication Data

US 2012/0298338 A1    Nov. 29, 2012

(51) Int. Cl.
| | |
|---|---|
| F28D 15/00 | (2006.01) |
| F28F 27/00 | (2006.01) |
| F28D 1/047 | (2006.01) |
| F28F 1/32 | (2006.01) |
| H05K 7/20 | (2006.01) |

(52) U.S. Cl.
CPC ............ *F28F 27/00* (2013.01); *F28D 1/0475* (2013.01); *F28F 1/32* (2013.01); *H05K 7/20745* (2013.01); *Y10T 29/49826* (2015.01)

(58) Field of Classification Search
CPC .............. F28F 1/003; F24F 2011/0084; H05K 7/20272; H05K 7/20745
USPC .................... 62/168, 228.3, 259.2, 382, 434; 165/104.31, 104.33
See application file for complete search history.

(56) References Cited

U.S. PATENT DOCUMENTS

| | | | |
|---|---|---|---|
| 4,787,212 A | 11/1988 | Hessey | 62/188 |
| 4,922,999 A | 5/1990 | Stokes et al. | 165/286 |
| 5,086,829 A | 2/1992 | Asakawa | 165/270 |
| 5,226,471 A | 7/1993 | Stefani | 165/200 |
| 5,323,847 A | 6/1994 | Koizumi et al. | 165/104.33 |
| 6,775,137 B2 * | 8/2004 | Chu | H05K 7/20754 165/120 |
| 7,031,154 B2 * | 4/2006 | Bash et al. | 361/690 |
| 7,535,709 B2 * | 5/2009 | Fan et al. | 361/695 |
| 7,646,603 B2 | 1/2010 | Bard et al. | 361/696 |
| 8,164,897 B2 * | 4/2012 | Graybill | H05K 7/20745 361/679.48 |
| 8,240,359 B2 * | 8/2012 | Garrett | 165/80.2 |
| 9,291,408 B2 * | 3/2016 | Iyengar | F28F 27/00 |
| 2004/0100770 A1 | 5/2004 | Chu et al. | |
| 2004/0206101 A1 * | 10/2004 | Bash et al. | 62/180 |
| 2005/0235671 A1 | 10/2005 | Belady et al. | 62/259.2 |
| 2005/0241802 A1 | 11/2005 | Malone et al. | 165/80.4 |
| 2006/0151147 A1 * | 7/2006 | Symonds | 165/11.1 |
| 2007/0159797 A1 | 7/2007 | Teneketges et al. | 361/699 |

(Continued)

*Primary Examiner* — Christopher R Zerphey
(74) *Attorney, Agent, or Firm* — Margaret A McNamara; Ido Tuchman (57) ABSTRACT

Methods of preventing overheating of computer equipment in a cabinet when a supply coolant to a cooler in the cabinet fails. An example embodiment is a data center that includes a plurality of cabinets and at least two main coolant supply lines. The cabinets are configured to house computer equipment and the main coolant supply lines provide coolant to the plurality of cabinets. Moreover, each cabinet includes a cooler and each of these coolers includes at least two radiators which receive coolant from different main coolant supply lines.

17 Claims, 7 Drawing Sheets

(56) References Cited

U.S. PATENT DOCUMENTS

| | | | |
|---|---|---|---|
| 2008/0094797 A1 | 4/2008 | Coglitore et al. | 361/687 |
| 2008/0158818 A1 | 7/2008 | Clidaras et al. | 361/699 |
| 2008/0232064 A1* | 9/2008 | Sato et al. | 361/687 |
| 2008/0245083 A1 | 10/2008 | Tutunoglu et al. | 62/115 |
| 2008/0266726 A1 | 10/2008 | Murakami et al. | 361/1 |
| 2009/0014546 A1* | 1/2009 | Yasuo | 236/49.3 |
| 2009/0056910 A1 | 3/2009 | Mallia et al. | 165/80.3 |
| 2009/0071636 A1* | 3/2009 | Novotny | 165/104.33 |
| 2009/0100848 A1* | 4/2009 | Kuriyama et al. | 62/132 |
| 2009/0126909 A1 | 5/2009 | Ellsworth, Jr. et al. | 165/104.33 |
| 2009/0188659 A1* | 7/2009 | Delia et al. | 165/239 |
| 2009/0301123 A1 | 12/2009 | Monk et al. | 62/259.2 |
| 2011/0067421 A1* | 3/2011 | Shiraishi | B60H 1/00978 62/149 |
| 2011/0265983 A1* | 11/2011 | Pedersen | F25B 41/00 165/279 |

\* cited by examiner

DATA CENTER WITH DUAL RADIATOR CABINETS FOR REDUNDANT OPERATION

BACKGROUND

The present invention relates to cabinets configured to house computer equipment in data centers, and more specifically to cabinets with coolers that contain two radiators for receiving coolant from different main coolant supply lines.

The American Society of Heating, Refrigerating and Air-Conditioning Engineers (ASHRAE) currently recommends that the temperature of air entering a cabinet should be between 18° C. to 27° C. However, the inlet air temperature may reach up to 32° C. for short periods of time without adverse consequences.

A cooler cools exhaust air from a cabinet. Coolant (i.e., chilled water) from a coolant distribution unit (CDU) enters the cooler and is heated by the cabinet's exhaust air. Thus, heat from the exhaust air is transferred to the coolant. The heated coolant leaves the cooler and returns to the CDU, where it is once again cooled. The CDU acts as a buffer between the coolant circulating in the data center and coolant used by a chiller plant.

Failure of a coolant supply line due, for example, to a coolant leak requires shutting a valve supplying coolant to the supply line. Such a failure typically results in some cabinets not cooling the exhaust air. In a conventional arrangement of coolant supply, a temporary coolant supply line shutdown may cause localized inlet air temperature to quickly increase beyond 32° C. Such a temperature rise may require shutdown of the electronic equipment in the cabinet to prevent overheating.

SUMMARY

One exemplary aspect of the invention is a data center that includes a plurality of cabinets and at least two main coolant supply lines. The cabinets are configured to house computer equipment. The main coolant supply lines provide coolant to the plurality of cabinets. Moreover, each cabinet includes a cooler. Each of these coolers includes at least two radiators which receive coolant from different main coolant supply lines.

Another exemplary aspect of the invention is a cabinet that is configured to house computer equipment that also includes at least two radiators. There are at least two main coolant supply lines that provide coolant to a plurality of cabinets. Further, a different main coolant supply line connects to each radiator in a cabinet.

Yet another exemplary aspect of the invention is a method for preventing the overheating of computer equipment in a cabinet which includes at least two radiators for cooling exhaust air. The method includes coupling each radiator to a different main coolant supply line. The main coolant supply lines provide coolant to a plurality of cabinets.

DETAILED DESCRIPTION

The present invention is described with reference to embodiments of the invention. Throughout the description of the invention reference is made to FIGS. 1-8.

As discussed in detail below, embodiments of the present invention can help maintain uniform air temperature in a cabinet when a coolant supply line fails. Embodiments of the invention can therefore help keep a data center running while the failed supply line is serviced.

Figure 1:
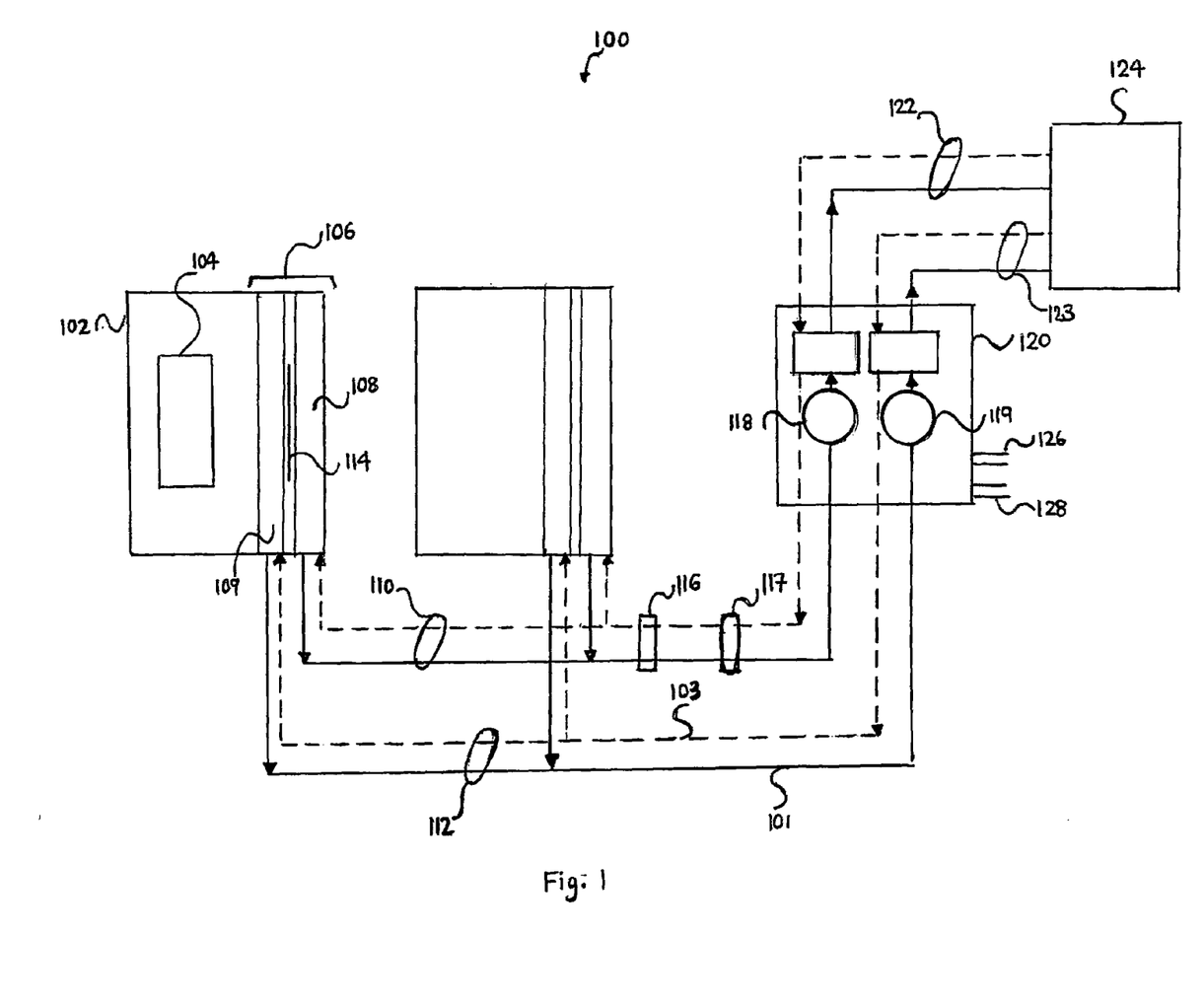
FIG. 1 shows a plan view of an example data center in accordance with the present invention.

FIG. 1 shows a plan view of an example data center 100 contemplated by the present invention. The data center 100 includes a plurality of cabinets 102 that are configured to house computer equipment 104. The data center 100 includes coolant supplied to the plurality of cabinets 102 from at least two main coolant supply lines 110 and 112. Each main coolant supply line 110 and 112 includes two coolant lines 101 and 103. The first coolant line 101 receives coolant from the plurality of cabinets 102 and the second coolant line 103 supplies coolant to the plurality of cabinets 102.

In the example data center 100, redundancy in the system ensures the cabinet's exhaust air will continue to be cooled if there is a failure along one of the main coolant supply lines 110 or 112, or if one of the two coolant pumps 118 or 119 fail, or if one of the two radiators 108 or 109 fail. In an embodiment of the invention, each main coolant supply line 110 and 112 may couple to one of at least two coolant pumps 118 and 119. The coolant pumps 118 and 119 may be enclosed within a coolant distribution unit 120. Furthermore, the coolant pumps 118 and 119 may also couple to one of at least two chiller supply lines 122 and 123 from a chiller plant 124. Further still, the coolant pumps 118 and 119 may couple to one of at least two independent power supplies 126 and 128.

In the example data center 100, each cabinet 102 includes a cooler 106 (also referred to wherein as a radiator assembly and heat exchanger) with at least two radiators 108 and 109. The cooler 106 may be a rear door heat exchanger (RDHx) and the supply coolant may be a liquid. Each radiator 108 and 109 receives coolant from different main coolant supply lines 110 and 112. The radiators 108 and 109 may be built as one monolithic assembly, but with two sets of coolant ports (in and out) for each radiator 108 and 109.

In one embodiment of the invention, the radiators 108 and 109 of the cooler 106 may be positioned perpendicular to the direction of air flow existing within the cabinet 102. Another embodiment of the invention may position the radiators 108 and 109 serially in the direction of air flow. A further embodiment may monolithically intertwine the radiators 108 and 109 with alternating tube and fin structures which are fluidically separate on the liquid side.

Another embodiment involves an air flow barrier 114 that may be included within the cooler 106 to prevent air flow to one of the two radiators 108 and 109 during a coolant supply failure to one of the radiators 108 or 109. The air flow barrier 114 may be a solid flap that would block and isolate one radiator 108 or 109 in the event of a coolant supply failure to that radiator 108 or 109 and then force the flow of all of the exhaust air through the other radiator 108 or 109.

A further embodiment of the invention may include at least one leak detector 116 or 117 for determining which main coolant supply line 110 and 112 has failed during a coolant failure. Two possible leak detectors are a pressure sensor 116 and a temperature sensor 117. Another embodiment of the invention may include automatically shutting down the coolant pump 118 or 119 attached to the failing main coolant supply line 110 or 112 when a failure is detected. In this embodiment, the coolant pump 118 or 119 connected to the non-failing main coolant supply line 110 or 112 will continue to supply coolant to the plurality of cabinets 102. This embodiment ensures that the cabinet's exhaust air continues to be cooled while the coolant failure is serviced.

Figure 2:
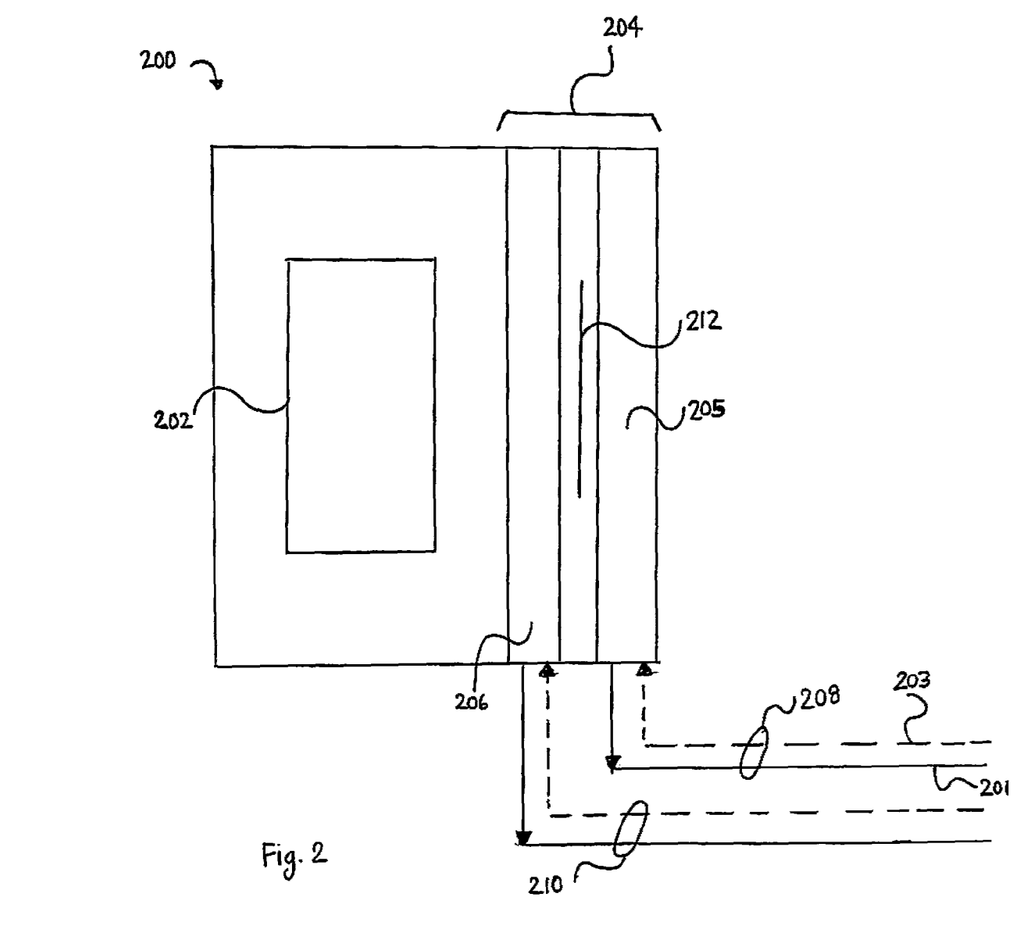
FIG. 2 shows a plan view of an example cabinet contemplated by the present invention.

FIG. 2 shows a plan view of an example cabinet 200 contemplated by the present invention. The cabinet 200 is configured to house computer equipment 202 and it includes a cooler 204 that contains at least two radiators 205 and 206. The radiators 205 and 206 of the cooler 204 may be positioned perpendicular to the direction of air flow existing within the cabinet 200. Furthermore, each of the radiators 205 and 206 connects to a different main coolant supply line 208 and 210. Each main coolant supply line 208 and 210 supplies coolant to a plurality of cabinets 200.

In the example cabinet 200, each main coolant supply line 208 and 210 includes two coolant lines 201 and 203. The first coolant line 201 receives coolant from the plurality of cabinets 200 and the second coolant line 203 supplies coolant to the plurality of cabinets 200.

In an embodiment of the invention, an air flow barrier 212 may be included within the cooler 204 to prevent air flow to one of the two radiators 205 and 206 during a coolant supply failure to one of the radiators 205 or 206.

Figure 3:
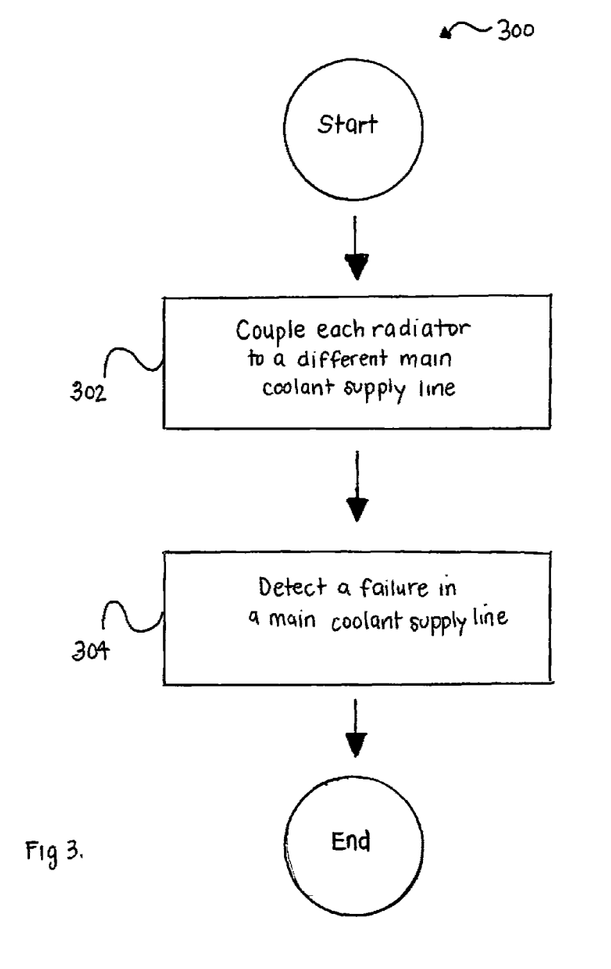
FIG. 3 shows a flowchart for an example method of preventing the overheating of computer equipment in a cabinet that includes at least two radiators for cooling exhaust air.

FIG. 3 shows a flowchart 300 for an example method of preventing the overheating of computer equipment in a cabinet that includes at least two radiators for cooling exhaust air. The method may include coupling operation 302. During this operation, each radiator of the cooler is coupled to a different main coolant supply line. Each main coolant supply line supplies coolant to a plurality of cabinets. The method may further include detecting operation 304. During this operation, a failure in a main coolant supply line can be detected.

Figure 4:
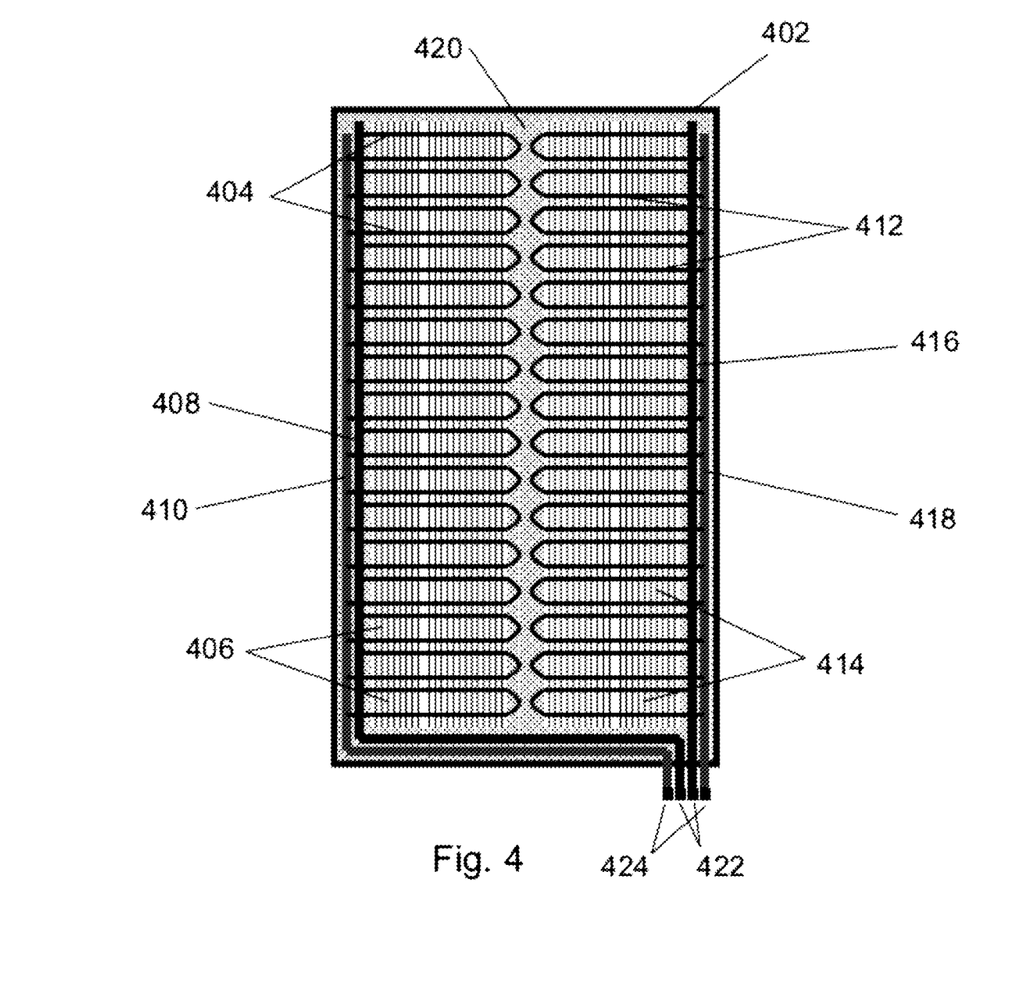
FIG. 4 shows another embodiment of a cabinet with a radiator assembly contemplated by the present invention.

FIG. 4 shows another embodiment of a cabinet with a radiator assembly 402 contemplated by the present invention. In one configuration, the radiator assembly 402 is mounted to a rack door frame. In the assembly shown, at least two radiators are positioned side-by-side along a plane perpendicular to the direction of airflow from the cabinet 402.

The radiator assembly 402 may include a first radiator loop with a first set of horizontal tubes 404 coupled to a first set of vertical air cooling fins 406. A first inlet manifold 408 supplies liquid to the first set of horizontal tubes 404 and a first exit manifold 410 carries liquid out of the first set of horizontal tubes 404.

The radiator assembly 402 includes a second radiator loop with a second set of horizontal tubes 412 coupled to second set of vertical air cooling fins 414. A second inlet manifold 416 supplies liquid to the second set of horizontal tubes 412 and a second exit manifold 418 carries liquid out of the second set of horizontal tubes 412. In one embodiment, the first and second set of horizontal tubes 404 and 412 are copper pipes.

The radiator assembly 402 may further include an air filter 420 configured to force cabinet exhaust air through the first and second set of cooling fins 406 and 414. The air filter 420 can therefore be used to prevent exhaust air from bypassing the heat exchanger. The air filter 420 may be constructed from, for example, plastic, foam material, and/or sheet metal.

The radiator assembly 402 may further include two inlet port quick connect couplers 422 and two outlet port quick connect couplers 424 that couple two hoses at the data center level. As discussed above, each radiator receives coolant from different main coolant supply lines. Additionally, each main coolant supply line includes a first coolant line receiving coolant from data center cabinets and a second coolant line supplying coolant to data center cabinets.

Figure 5:
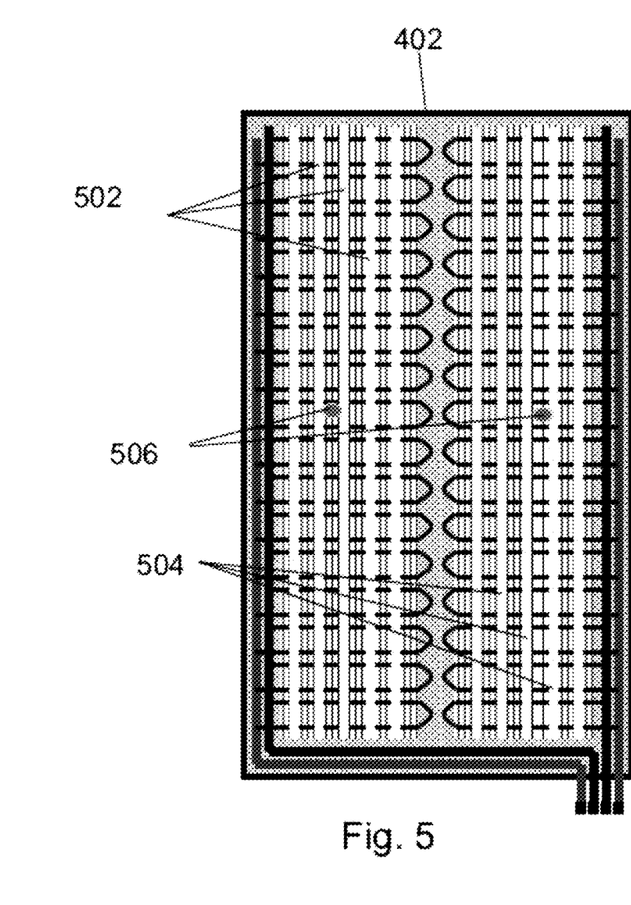
FIG. 5 shows another embodiment of a radiator assembly contemplated by the present invention.

FIG. 5 shows another embodiment of the radiator assembly 402. The radiator assembly 402 includes air flow barriers or louvers 502 and 504 configured to prevent air flow to one of the two radiators during a cooling failure at one of the radiators. The radiator assembly 402 may further include temperature sensors 506 to measure the air temperature near the radiator assembly 402. As discussed below, the temperature sensors 506 are configured to sense a cooling failure at the radiators.

Figure 6:
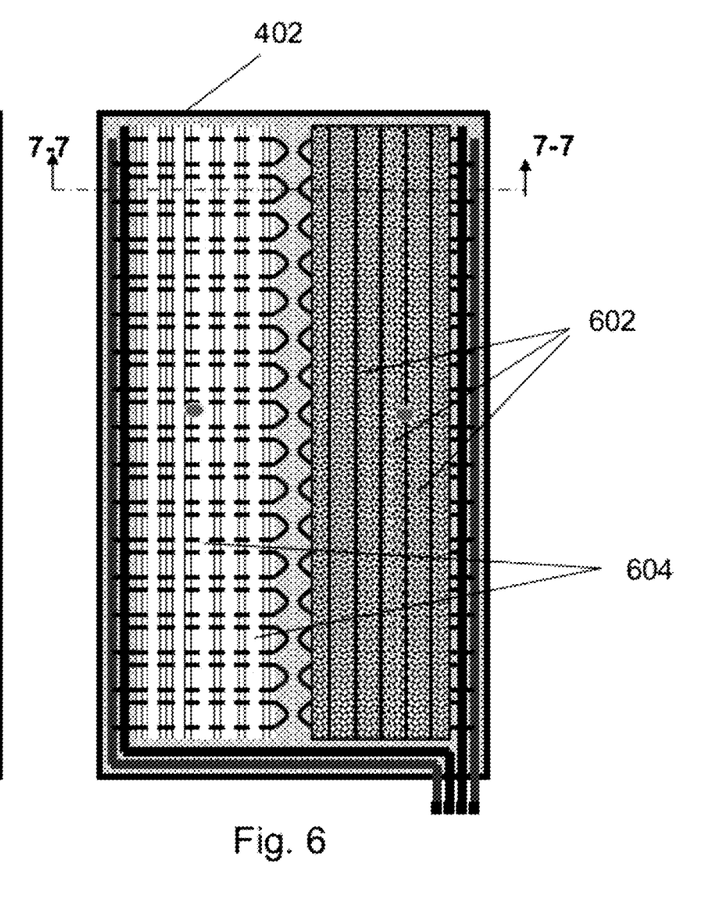
FIG. 6 shows a radiator assembly with a detected cooling failure.

FIG. 6 shows the radiator assembly 402 with a detected cooling failure. As illustrated, a first set of louvers 602 are in a closed position and a second set of louvers 604 are in an open position. Thus, the closed louvers 602 act as an air barrier, diverting exhaust air from the radiator with the cooling failure to the functioning radiator.

Figure 7:
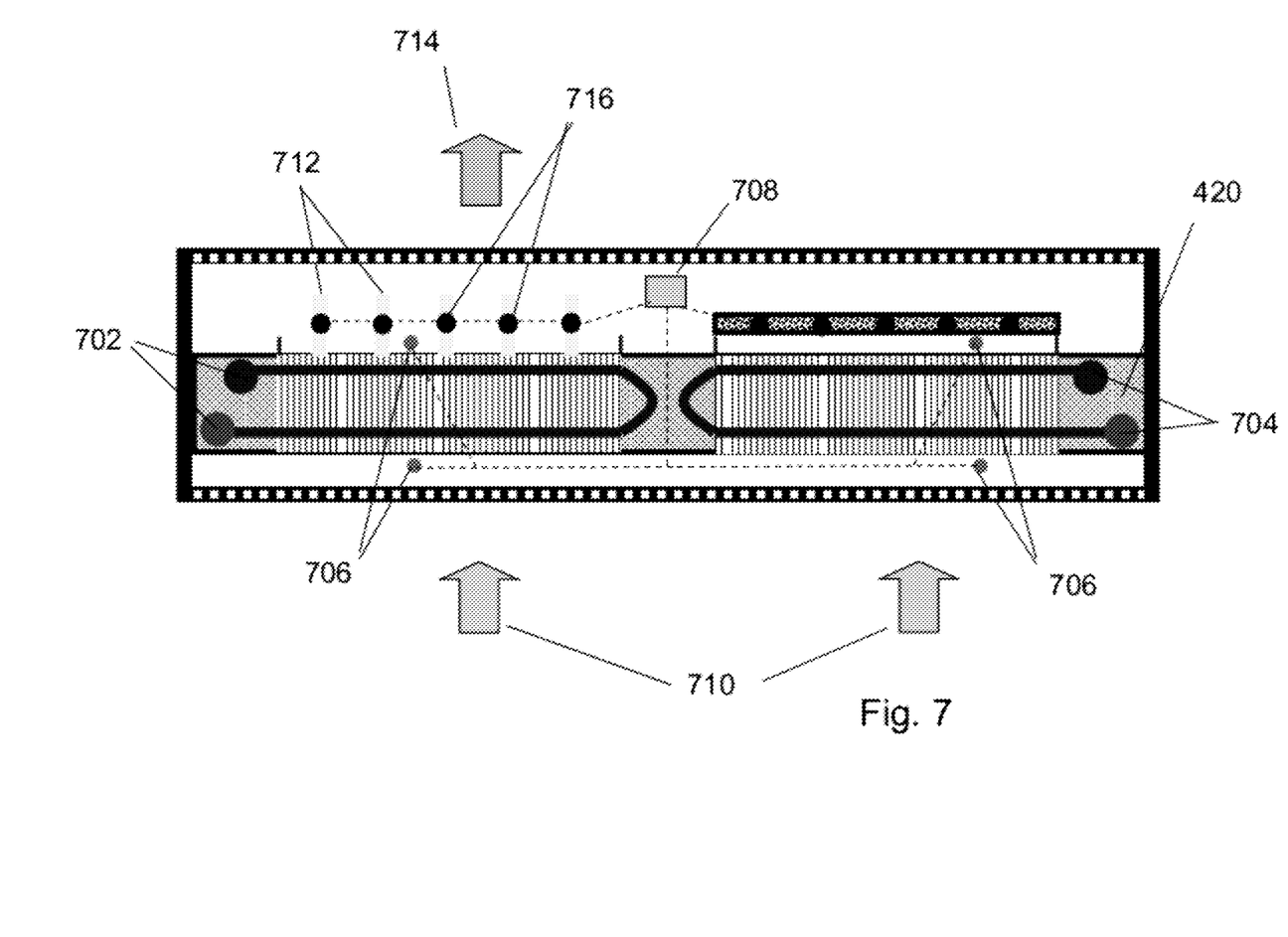
FIG. 7 is a cross sectional view of the radiator assembly 402 along section line 7-7 of FIG. 6.

FIG. 7 is a cross sectional view of the radiator assembly 402 along section line 7-7 of FIG. 6. As mentioned above, the air filter 420 is positioned to prevention exhaust air from bypassing the radiator fins of each radiator loop 702 and 704. Furthermore, each radiator loop includes front and back temperature sensors 706. A louver controller 708 computes the temperature difference between the front temperature sensor and the back temperature sensor. If the temperature difference is greater than a predetermined threshold value, the radiator loop 702 is considered functional and the loop's louvers are maintained in the open position. Thus, hot exhaust air 710 passes through the functioning radiator loop 702 and the open louvers 712, where it emerges from the radiator assembly as cooled air 714.

If the temperature difference between the front and back temperature sensors is less than the preset threshold value, the radiator loop 704 is determined to be non-functional. In this case, the louver controller 708 closes the failing loop's louvers. Thus, hot exhaust air 710 is prevented from escaping through the malfunctioning radiator loop 704 and is diverted to the functional radiator loop 702.

In one embodiment, the louvers are opened and closed using controllable pivots 716 that the louvers swivel around. In another embodiment, no louvers are present at radiator assembly 402, however, the temperature sensors 706 are used to alert data center technicians of a malfunctioning heat exchanger.

Figure 8:
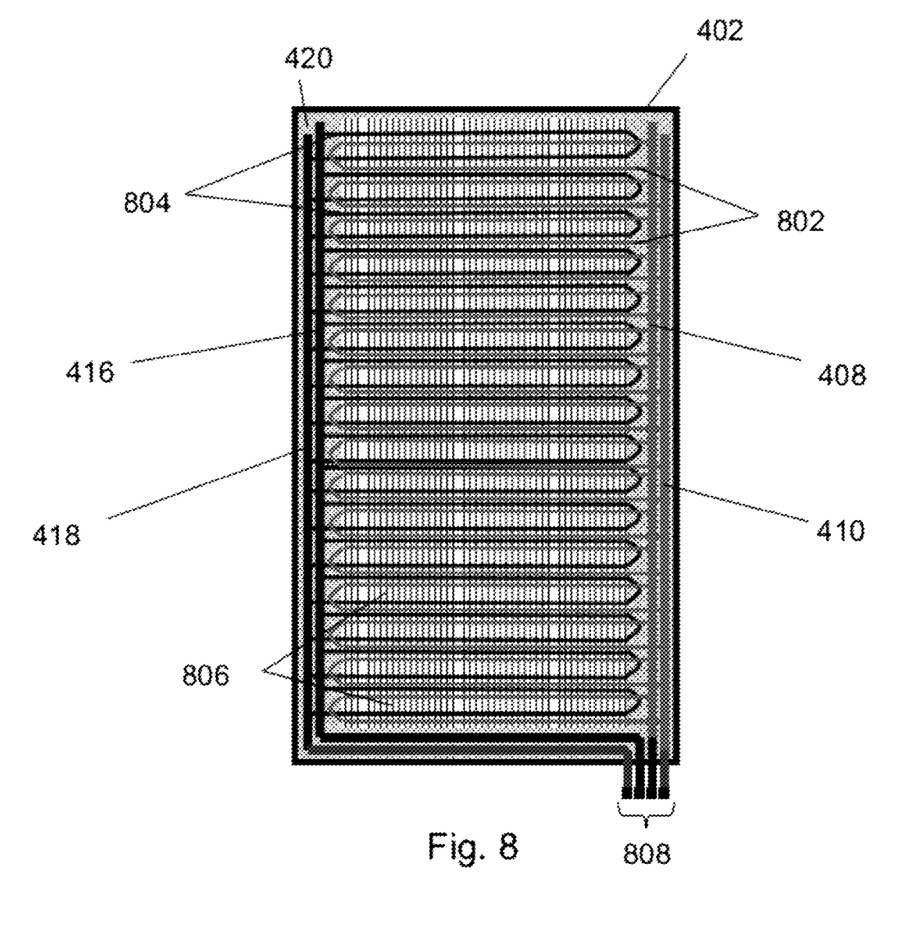
FIG. 8 shows a radiator assembly with two radiator coils intertwined.

In FIG. 8, the two radiator coils 802 and 804 are intertwined. In this configuration, the coils share air cooling fins 806 and no louvers are present at radiator assembly 402. It is contemplated that the intertwined radiator coils 802 and 804 can be staggered in a horizontal plane or a vertical plane, depending on the spatial and air flow demands to the cabinet.

For example, by staggering the coils in the vertical plane, the depth of the air cooling fins can be reduced in the direction of airflow.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A data center comprising:
   a plurality of coolers, each of the coolers includes at least a first radiator and a second radiator;
   a plurality of cabinets configured to house computer equipment, each of the cabinets includes a cooler from the plurality of coolers, each of the radiators in the cooler receiving coolant from a different one of main coolant supply lines;
   a plurality of first louvers configured to pivot to a first closed position and a first open position, the first closed position restricting air flow through the first radiator, the first open position allowing air flow through the first radiator;
   a plurality of second louvers configured to pivot to a second closed position and a second open position, the second closed position restricting air flow through the second radiator, the second open position allowing air flow through the second radiator;
   at least one leak detector for determining which of the main coolant supply lines fails;
   a controller configured to receive from the at least one leak detector, indication of which of the coolant supply lines has failed, and in response configure one of the first or second plurality of louvers in association with the first or second radiator receiving coolant from the failed coolant supply line to pivot to the closed position, and the other of the first or second plurality of louvers to remain in the open position.

2. The data center of claim 1, wherein each main coolant supply line includes a first coolant line receiving coolant from the plurality of cabinets and a second coolant line supplying coolant to the plurality of cabinets.

3. The data center of claim 1, wherein the radiators within each of the coolers are positioned perpendicular to the direction of air flow exiting the cabinet.

4. The data center of claim 1, wherein the coolers include a plurality of temperature sensors configured to sense the cooling failure at one of the radiators.

5. The data center of claim 1, wherein the leak detector is a pressure sensor.

6. The data center of claim 1, further comprising at least two coolant pumps, wherein each of the main coolant supply lines is coupled to a different one of the at least two coolant pumps.

7. The data center of claim 6, further comprising at least two independent power supplies, wherein each of the coolant pumps is coupled to a different one of the at least two independent power supplies.

8. The data center of claim 6, further comprising a coolant distribution unit enclosing the at least two coolant pumps.

9. The data center of claim 6, further comprising at least two chiller supply lines coupled a chiller plant, wherein each of the coolant pumps is coupled to a different one of the at least two chiller supply lines.

10. A system comprising:
    a plurality of main coolant supply lines, each of the main coolant supply lines supplying coolant to a plurality of cabinets;
    a cabinet from the plurality of cabinets configured to house computer equipment, the cabinet including a cooler, the cooler including a first radiator and a second radiator, each of the first and second radiators connects to a different main coolant supply line from the plurality of main coolant supply lines;
    a plurality of louvers corresponding to each of the at least two radiators, each plurality of louvers configured to pivot to a closed position and an open position, the closed position restricting air flow through the corresponding radiator, the open position allowing air flow through the corresponding radiator;
    at least one leak detector for determining which of the main coolant supply lines fails;
    a controller configured to receive from the at least one leak detector, indication of which of the main coolant supply lines has failed, and in response configure the plurality of louvers corresponding with the radiator receiving coolant from the failed coolant supply line to pivot to the closed position, and the other of the plurality of louvers to remain in the open position.

11. The system of claim 10, wherein each main coolant supply line includes a first coolant supply line receiving coolant from the plurality of cabinets and a second coolant supply line supplying coolant to the plurality of cabinets.

12. The system of claim 10, wherein the first and the second radiators within each of the coolers are positioned side by side along a plane perpendicular to the direction of air flow exiting the cabinet.

13. The data center of claim 1, wherein each of the main coolant supply lines supplies coolant to the first radiator and the second radiator.

14. A server cabinet comprising:
    a first radiator coupled a first main coolant supply line, the first radiator including a first front side and a first back side such that air flow enters the first radiator at the first front side and exists the first radiator at the first back side;
    a second radiator coupled to a second main coolant supply line, the second radiator including a second front side and a second back side such that air flow enters the second radiator at the second front side and exists the second radiator at the second back side;
    a plurality of first louvers configured to pivot to a first closed position and a first open position, the first closed position restricting air flow through the first radiator, the first open position allowing air flow through the first radiator;
    a plurality of second louvers configured to pivot to a second closed position and a second open position, the second closed position restricting air flow through the second radiator, the second open position allowing air flow through the second radiator;
    at least one leak detector for determining which of the main coolant supply lines fails;
    a controller configured to receive from the at least one leak detector, indication of which of the coolant supply lines has failed, and in response configure one of the first or second plurality of louvers in association with the first or second radiator receiving coolant from the failed coolant supply line to pivot to the closed position, and the other of the first or second plurality of louvers to remain in the open position.

15. The server cabinet of claim 14, further comprising:
a first front temperature sensor positioned at the front side of the first radiator;
a first back temperature sensor positioned at the back side of the first radiator;
a second front temperature sensor positioned at the front side of the second radiator; and
a second back temperature sensor positioned at the back side of the second radiator.

16. The server cabinet of claim 14, further comprising:
wherein the first main coolant supply line supplies coolant to a plurality of other radiators; and
wherein the second main coolant supply line supplies coolant to the plurality of other radiators.

17. The server cabinet of claim 14, wherein the first radiator and the second radiator are positioned side by side along a plane perpendicular to the direction of air flow exiting the cabinet.

\* \* \* \* \*